(12) United States Patent
Sentoku et al.

(10) Patent No.: US 7,771,905 B2
(45) Date of Patent: Aug. 10, 2010

(54) METHOD AND PROGRAM FOR CALCULATING EXPOSURE DOSE AND FOCUS POSITION IN EXPOSURE APPARATUS, AND DEVICE MANUFACTURING METHOD

(75) Inventors: Koichi Sentoku, Kawachi-gun (JP); Hideki Ina, Toshima-ku (JP); Koji Mikami, Nikko (JP); Yoshiaki Sugimura, Utsunomiya (JP); Hiroto Yoshii, Utsunomiya (JP); Tomoyuki Miyashita, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 866 days.

(21) Appl. No.: 11/618,137

(22) Filed: Dec. 29, 2006

(65) Prior Publication Data

US 2007/0154824 A1 Jul. 5, 2007

(30) Foreign Application Priority Data

Jan. 5, 2006 (JP) ............................. 2006-000950
Dec. 27, 2006 (JP) ............................. 2006-353324

(51) Int. Cl.
 *G03F 9/00* (2006.01)
(52) U.S. Cl. .......................................... 430/22; 430/30
(58) Field of Classification Search ................... 430/22, 430/30
See application file for complete search history.

(56) References Cited

U.S. PATENT DOCUMENTS

| 6,013,401 | A | 1/2000 | McCullough et al. |
| 6,869,807 | B2 | 3/2005 | Yoshitake et al. |
| 6,873,938 | B1 | 3/2005 | Paxton et al. |
| 6,989,544 | B2 | 1/2006 | Van Der Veen |

FOREIGN PATENT DOCUMENTS

| JP | 62-132318 | 6/1987 |
| JP | 10-032160 | 2/1998 |
| JP | 10-064801 | 3/1998 |
| JP | 2003-059813 | 2/2003 |
| JP | 2003-142397 | 5/2003 |
| JP | 2003-229358 | 8/2003 |
| JP | 2005-094015 | 4/2005 |

*Primary Examiner*—Christopher G Young
(74) *Attorney, Agent, or Firm*—Rossi, Kimms & McDowell LLP

(57) ABSTRACT

A method for calculating an offset of an exposure dose and a focus position in an exposure apparatus that exposes a substrate via an original includes the steps of obtaining information of a shape of a pattern formed on the substrate using the exposure apparatus, calculating a shift amount between a critical dimension contained in the information of the shape of the pattern and a reference value of the critical dimension, and calculating an offset of the focus position based on the information of the shape of the pattern, and calculating the offset of the exposure dose based on the shift amount and the offset of the focus position.

6 Claims, 13 Drawing Sheets

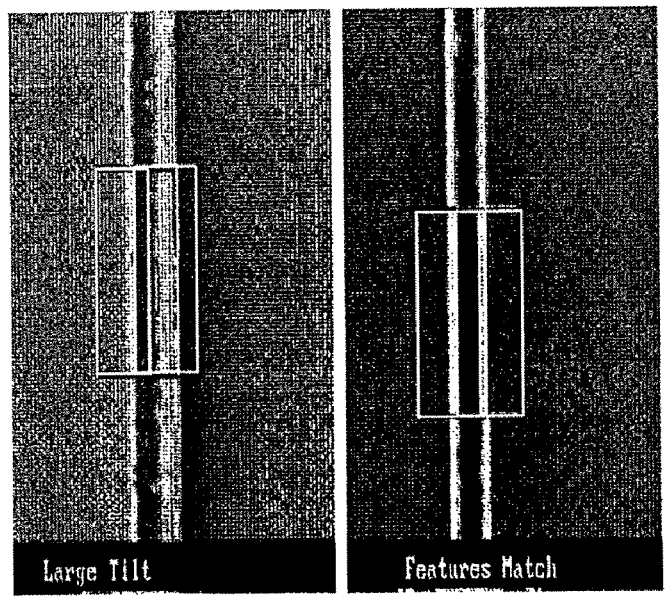
TILT BY 15° TO THE RIGHT    TILT BY 0°
FIG. 6    FIG. 5
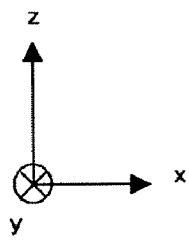

| focus | dose | tcd(nm) | mcd(nm) | bcd(nm) | height(nm) | swa (deg.) |
|---|---|---|---|---|---|---|
| -0.12 | 5.904 | 61.50 | 92.08 | 117.98 | 207.91 | 77.48 |
| -0.09 | 5.904 | 70.25 | 96.89 | 120.67 | 207.91 | 78.82 |
| -0.06 | 5.904 | 76.51 | 100.16 | 122.32 | 207.91 | 79.73 |
| -0.03 | 5.904 | 80.92 | 102.22 | 122.97 | 207.91 | 80.62 |
| 0 | 5.904 | 83.62 | 103.10 | 122.66 | 207.91 | 81.26 |
| 0.03 | 5.904 | 84.77 | 102.77 | 121.30 | 207.91 | 81.71 |
| 0.06 | 5.904 | 84.59 | 101.33 | 118.83 | 207.91 | 82.08 |
| 0.09 | 5.904 | 82.84 | 98.51 | 115.34 | 207.91 | 82.74 |
| 0.12 | 5.904 | 79.74 | 94.45 | 110.61 | 207.91 | 82.95 |
| -0.12 | 6.068 | 57.01 | 88.22 | 113.97 | 207.91 | 77.31 |
| -0.09 | 6.068 | 66.49 | 93.05 | 116.78 | 207.91 | 78.72 |
| ⁓ | | | | | | |
| 0.03 | 7.216 | 60.82 | 78.31 | 94.45 | 207.91 | 82.37 |
| 0.06 | 7.216 | 60.53 | 76.33 | 91.49 | 207.91 | 82.94 |
| 0.09 | 7.216 | 58.23 | 72.77 | 86.93 | 207.91 | 83.47 |
| 0.12 | 7.216 | 53.76 | 67.12 | 80.63 | 207.91 | 83.74 |

METHOD AND PROGRAM FOR CALCULATING EXPOSURE DOSE AND FOCUS POSITION IN EXPOSURE APPARATUS, AND DEVICE MANUFACTURING METHOD

BACKGROUND OF THE INVENTION

The present invention relates generally to a technology of calculating an exposure dose and a focus position in an exposure apparatus.

The pattern exposure technology that transfers an LSI pattern on a reticle onto a wafer is required to improve the productivity as well as promoting the fine processing to a transferable pattern. The exposure process in the exposure apparatus sets an optimal value of an exposure condition, such as a focus position and an exposure dose, for each process and for each exposure layer, in exposing the wafer.

The optimal exposure condition, such as the focus position and the exposure dose, is set as a result of that a shape measurement apparatus, such as a critical dimension scanning electron microscope ("CD-SEM") measures a predetermined resist pattern shape. An etched pattern shape is also measured, and both shapes are compared. However, various errors, such as the resist's refractive index and thickness, exposure control and focusing of the exposure apparatus, a development time period, a developer's characteristic, an uneven hot plate, a PEB temperature and time period, and a reticle manufacturing error (flatness), differentiate their measurement values, cause a CD error, and lower a manufacturing yield rate. One proposed method calculates and controls the exposure dose using a means for setting a resist's refractive index and thickness. See, for example, Japanese Patent Application, Publication No. 62-132318. Another proposal improves the wafer's CD error by adjusting the exposure dose against the reticle error. See, for example, Japanese Patent Application, Publication No. 10-032160. When the CD fluctuates approximately concentrically to the wafer, still another proposal prepares a function between a distance from a wafer's center and the exposure dose, and controls the exposure dose for each shot. See, for example, Japanese Patent Application, Publication No. 10-064801. Yet another proposed method prepares an exposure dose map for each shot from CD measurement values of the exposed whole wafer plane and exposed whole shot plane, and controls the exposure dose in accordance with the map. See, for example, Japanese Patent Application, Publication No. 2005-094015.

The fine-processing demand gradually increases a numerical aperture ("NA") of a projection optical system in the exposure apparatus, and gradually decreases a depth of focus ("DOF"). For example, the DOF for the 90 nm CD pattern is merely about 200 nm with 10% latitude for the CD fluctuation.

A method of setting the exposure condition for the narrow DOF is required to change a focus position to an exposure dose window ("ED window") as well as control over a CD value through a change of an exposure dose.

Japanese Patent Applications, Publication Nos. 62-132318, 10-032160, 10-064801, and 2005-094015 propose methods of setting an exposure dose suitable for each of various errors, but are silent about an effective control method of controlling a focusing position. This is because no prior art provide exposures with minutely changed focus positions unlike a focus exposure matrix (FEM) pattern, or an approach that calculate a shift amount of a focus position from one exposure condition. One reason rests in use of a CD-SEM for a CD measurement. The CD measurement from one mark provides only one measurement result of a CD value, and only one variable can be varied. Therefore, Japanese Patent Applications, Publication Nos. 62-132318, 10-032160, 10-064801, and 2005-094015 has limits to the transferable pattern. Accordingly, one proposed method calculates an offset of an exposure dose and an offset of a focus position (substrate position) in the exposure apparatus. See, for example, Japanese Patent Application, Publication No. 2003-142397, which creates a library of a correlation among the offsets of the exposure dose and the focus position (substrate position) and a light intensity signal waveform of a pattern, and measures the light intensity signal waveform of the pattern obtained for a certain exposure dose and focus position. Thereafter, this reference calculates the offsets of the exposure dose and the focus position based on the library and the measured light intensity signal waveform.

Nevertheless, the previously prepared library does not conform to the status quo in the method of Japanese Patent Application, Publication No. 2003-142397 as an extrinsic factor that affects the CD fluctuates, such as the resist's refractive index and thickness, exposure control and focusing in the exposure apparatus, a development time period, a developer's characteristic, an uneven hot plate, a PEB temperature and time period, and a reticle manufacturing error (flatness). Then, this method needs to properly update the library.

SUMMARY OF THE INVENTION

The present invention is directed to a technology that calculates the offsets of the exposure dose and the focus position, and is less likely to be affected by the extrinsic factor or a fluctuation of the lithography environment.

A method according to one aspect of the present invention for calculating an offset of an exposure dose and a focus position in an exposure apparatus that exposes a substrate via an original includes the steps of obtaining information of a shape of a pattern formed on the substrate using the exposure apparatus, calculating a shift amount between a reference value of a critical dimension and the critical dimension contained in the information of the shape of the pattern, and calculating an offset of the focus position based on the information of the shape of the pattern, and calculating the offset of the exposure dose based on the shift amount and the offset of the focus position.

Other objects and further features of the present invention will become readily apparent from the following description of the preferred embodiments with reference to accompanying drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 5 is image data showing a measurement result using a normal CD-SEM.

FIG. 6 is image data showing a measurement result obtained from an observation of a wafer shown in FIG. 5 that is inclined by 15°.

DESCRIPTION OF THE EMBODIMENTS

Embodiments of the present invention will now be described in detail in accordance with the accompanying drawings.

Figure 1:
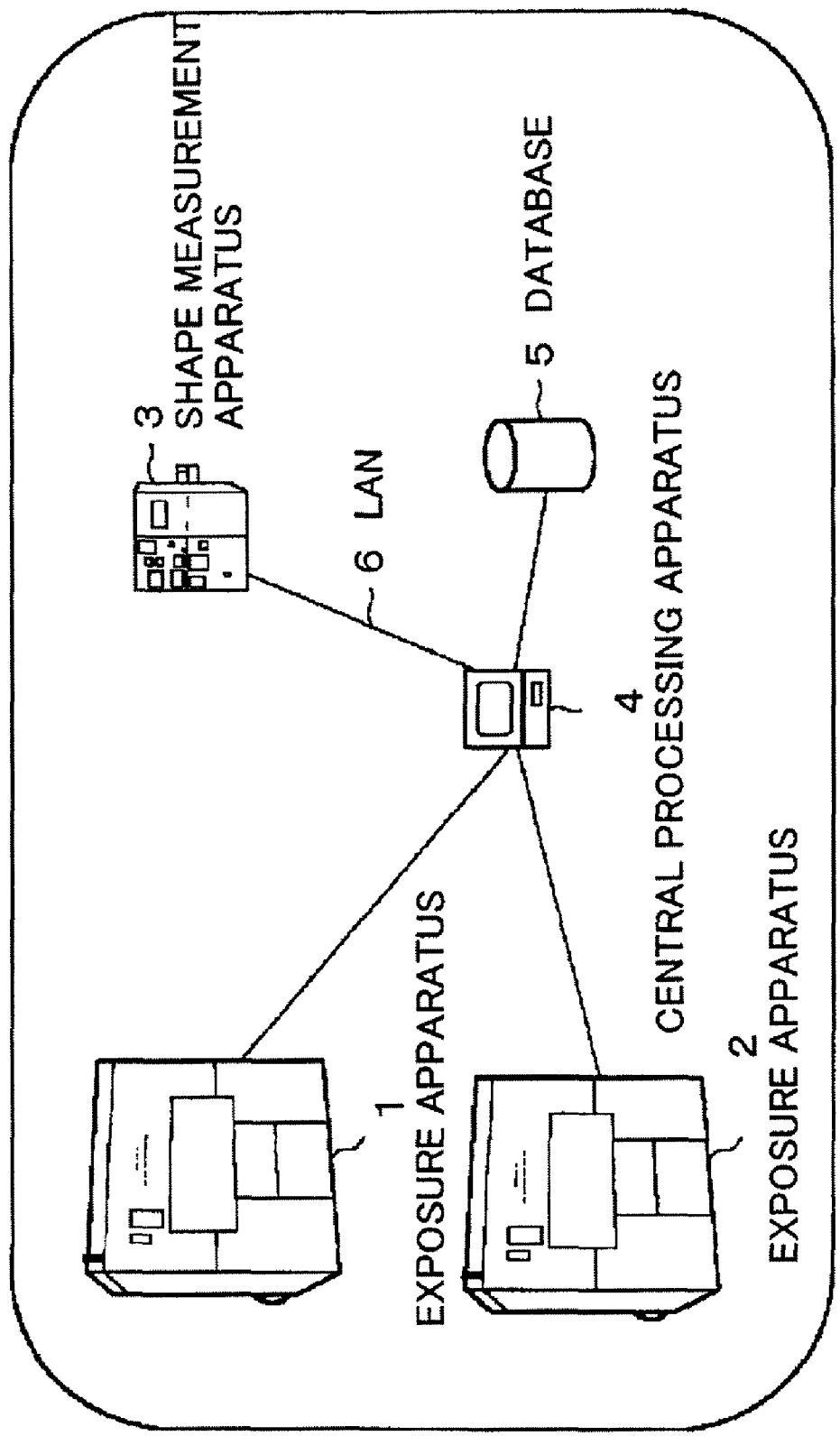
FIG. 1 is a schematic block diagram of a semiconductor manufacturing system according to one embodiment.

Referring now to FIG. 1, a description will be given of a semiconductor manufacturing system. The semiconductor manufacturing system includes plural exposure apparatuses (1 and 2 in FIG. 1), a shape measurement apparatus 3, a central processing apparatus 4 serves as a computer, a database 5, which are connected by a LAN 6, such as an in-house LAN.

The exposure apparatuses 1 and 2 are scanning exposure apparatuses, each of which exposes a circuit of a reticle 20 onto a wafer 40 in a step-and-scan manner.

The shape measurement apparatus 3 obtains three-dimensional shape information of a pattern formed on a substrate using the exposure apparatus that exposes the substrate via the original and uses a CD-SEM. The central processing apparatus 4 calculates a shift amount between the CD contained in the shape information and the reference value of the CD based on the pattern's three-dimensional shape information, and calculates the offsets of the exposure dose and the focus position. Here, the offset of the exposure dose is a gap from the optimal (target) exposure dose when target pattern is formed on the wafer. It is similar about the focus position. The focus position is the position of the substrate in exposed areas. The focus position is represented by a position in the optical-axis direction of the projection optical system. The database 5 forms a database and stores data, such as various measurement values from the exposure apparatuses 1 and 2, and the shape measurement apparatus 3. The central processing apparatus 4 optimizes the exposure dose and the focus position, and informs the exposure apparatuses 1 and 2 of the optimized ones.

Figure 2:
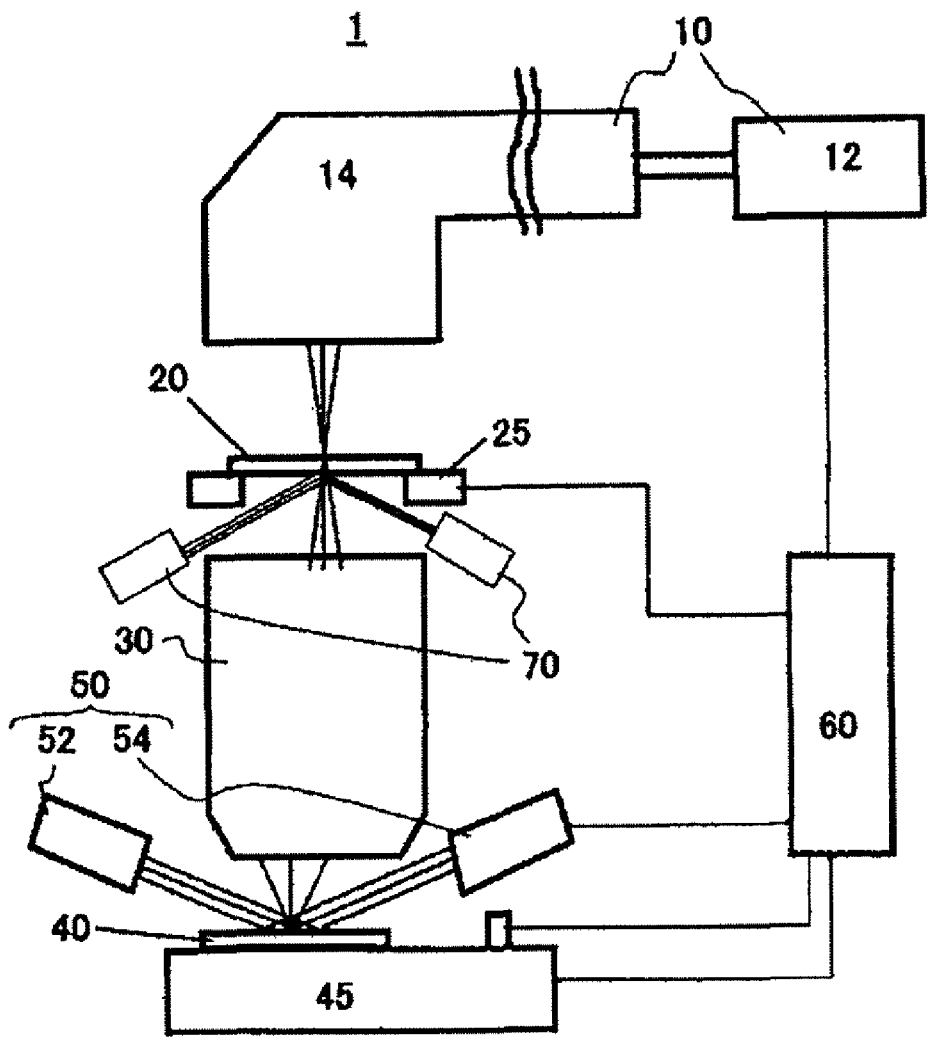
FIG. 2 is a schematic block diagram of a structure of an exposure apparatus shown in FIG. 1.

Referring now to FIG. 2, a description will be given of the exposure apparatus 1.

The exposure apparatus 1 is a scanning exposure apparatus that exposes a circuit pattern of a reticle 20 onto a wafer 40 in a step-and-scan manner. The exposure apparatus 1 includes, as shown in FIG. 2, an illumination apparatus 10, a reticle stage 25 that supports the reticle 20, a projection optical system 30, a wafer stage 45 that supports the wafer 40, a focus/tilt detection system 50, and a controller 60. The controller 60 has a CPU and a memory, is electrically connected to the illumination apparatus 10, the reticle stage 25, the wafer stage 45, and the focus/tilt detection system 50, and controls the operation of the exposure apparatus 1. The controller 60 in this embodiment operates and controls so as to optimally set the wavelength of the light used for the focus/tilt detection system 50 to detect a surface position of the wafer 40. The exposure apparatus 1 of this embodiment uses the step-and-scan manner, but the present invention is applicable to a step-and-repeat manner.

The illumination apparatus 10 includes a light source 12 and an illumination optical system 14, and illuminates the reticle 20 that has a circuit pattern to be transferred.

The light source 12 can use an ArF excimer laser with a wavelength of approximately 193 nm, but the light source may use a KrF excimer laser having a wavelength of about 248 nm, an $F_2$ laser with a wavelength of approximately 157 nm, an Extreme Ultraviolet ("EUV") light source, and a mercury lamp having a wavelength of 365 nm.

The illumination optical system 14 is an optical system that illuminates the reticle (mask) 20 that serves as an original, which is arranged on a target plane to be illuminated, using the light from the light source 12. The illumination optical system 14 includes a lens, a mirror, an optical integrator, a stop, etc. The illumination optical system 14 can use both axial and off-axial lights. The optical integrator is a fly-eye lens, but may use two sets of cylindrical arrays, an optical rod, and a diffraction optical system.

The reticle 20 is made, for example, of quartz, and has a circuit pattern to be transferred. The reticle 20 is supported and driven by the reticle stage 25. The exposure apparatus 1 includes a reticle detector 70 of an obliquely light introducing system that detects a position of the reticle 20 so as to arrange the reticle 20 in place.

The reticle stage 25 supports the reticle 20 via a reticle chuck (not shown), and is connected to a moving mechanism (not shown). The projection optical system 30 projects the pattern of the reticle 20 onto the wafer 40, and can use a dioptric optical system, a catadioptric optical system or a catoptric optical system.

A photoresist is applied onto the wafer 40 that serves as a substrate. Instead of the wafer 40, another substrate, such as a liquid crystal substrate and a glass plate, may be used.

The wafer stage 45 supports the wafer 40 via a wafer chuck (not shown).

The focus/tilt detection system 50 includes, as shown in FIG. 2, an illumination part 52 that introduces the light to the wafer 40's surface at a high incident angle, a detector 54 that detects an image shift of the light reflected on the surface of the wafer 40, and an operating part. The illumination part 52 includes a light source, a light synthesizer, a patterned plate, an imaging lens, and a mirror. The detector 54 includes a mirror, a lens, an optical branching filter, and a light receiving unit.

The exposure apparatus 1 may serve as the shape measurement apparatus 3, the central processing apparatus 4, and the database 5 in the semiconductor manufacturing system shown in FIG. 1. That embodiment can provide the same operation and effect as those of the above semiconductor manufacturing system.

Figure 3:
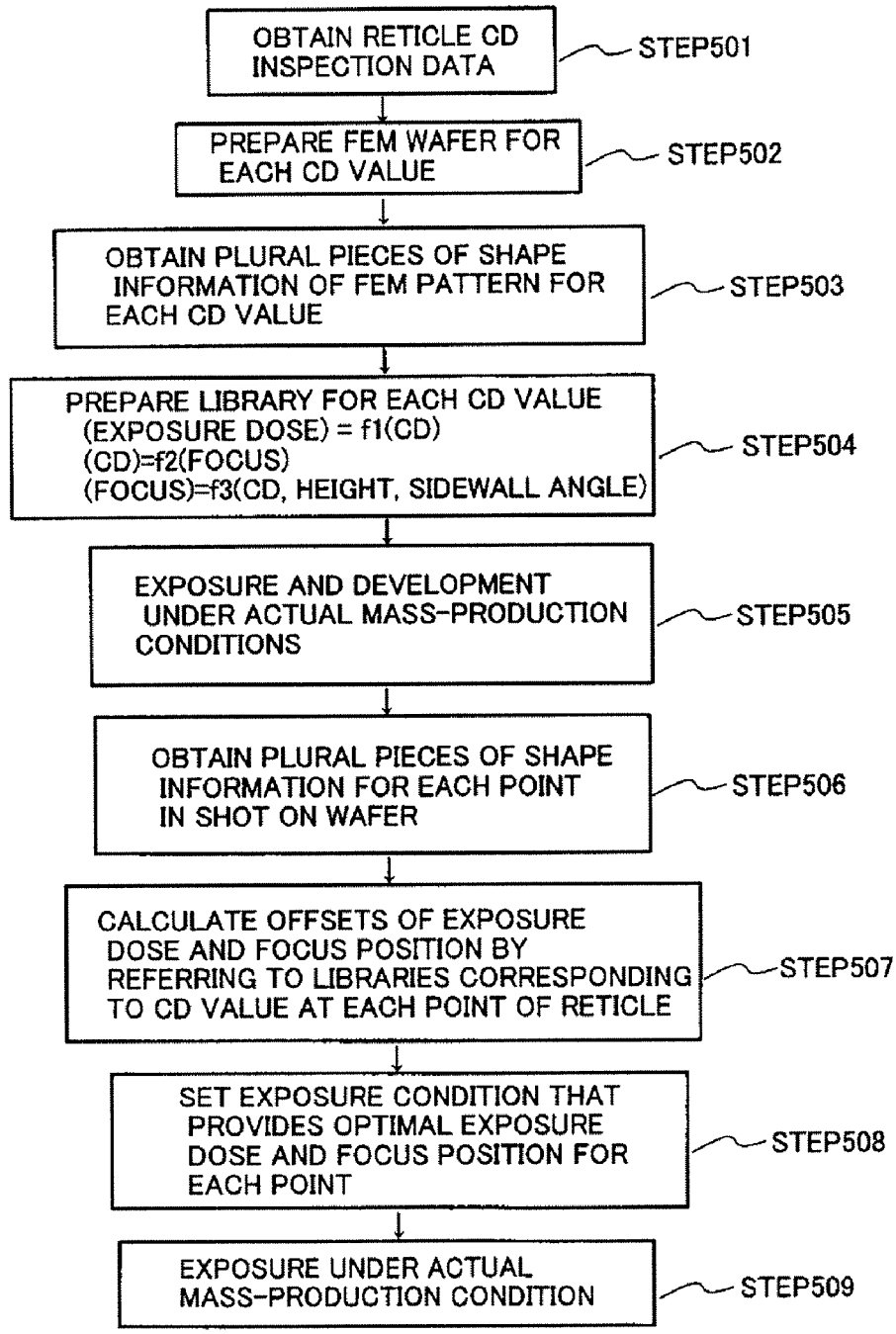
FIG. 3 is a flowchart showing an exposure method of the exposure apparatus shown in FIG. 2.

Referring now to FIG. 3, a description will be given of the exposure method 500 of this embodiment. Here, FIG. 3 is a flowchart of the exposure method 500.

The exposure method 500 exposes the substrate by calculating at least the offset of the focus position among the offsets of the exposure dose and the focus position in the exposure apparatus that exposes the substrate via the original.

The flowchart of the exposure method 500 is roughly classified into three stages. The first stage includes the steps 501 to 504, correlates the exposure dose, the focus position, and the FEM pattern with plural pieces of three-dimensional shape information obtained for each shot, and prepares a library in advance. More specifically, these steps prepare an FEM wafer on which the FEM pattern is exposed, set the optimal exposure condition (i.e., the exposure dose and the focus position) utilizing the FEM wafer, and prepare the library through the multivariate analysis. The FEM pattern, as used herein, is a pattern exposed in a matrix on the wafer having plural shots with parameters of the focus position and the exposure dose.

Based on the CD inspection result of the reticle pattern that is actually used in the mass-production stage, for a pattern having a large CD error, the FEM pattern that uses the CD is also prepared. Next follows a correlation with plural pieces of three-dimensional shape information. A library corresponding to the CD is then prepared.

The next stage includes the steps 505 to 507, and calculates the offsets of the focus position and the exposure dose. These steps execute exposure with the reticle and wafer for the mass-production stage, and measure the resist pattern shape exposed on the wafer. Next follows a verification with the library corresponding to the reticle's CD, and the offsets of the focus position and the exposure dose from the optimal exposure condition are calculated.

Finally, the calculated offset data is sent to the exposure apparatus 1, and the exposure dose and the focus position are re-optimized (step 508). In the mass-production stage, wafers are exposed under the re-optimized exposure condition (step 509).

Next follows a detailed description of each step.

First, CD inspection data of a reticle used for the mass-production stage is acquired (step 501). This embodiment prepares the reticle, and then measures the CD of an actual device pattern at plural points on the reticle. However, even when the CD measurement value falls within the manufacture latitude, if the optimal exposure dose and focus position differ after the pattern is transferred onto the wafer, developed, and etched, the pattern is regarded as a pattern for which a difference of the CD value should be considered. A location of the pattern on the reticle for which the difference should be considered, and a classifying CD value are determined from the reticle's CD inspection data obtained in the step 501.

Next follows a preparation of the FEM wafer (that has the FEM pattern) to the pattern for which the CD value difference should be considered as a result of the step 501 (step 502). The wafer may be a wafer actually used for the mass-production stage, or a test wafer configured similar to the wafer. A pattern forming range may be limited to a fine range having only part of the pattern for which the CD value difference should be considered, reducing the influence of flatness errors of the wafer and reticle to be used.

Figure 4:
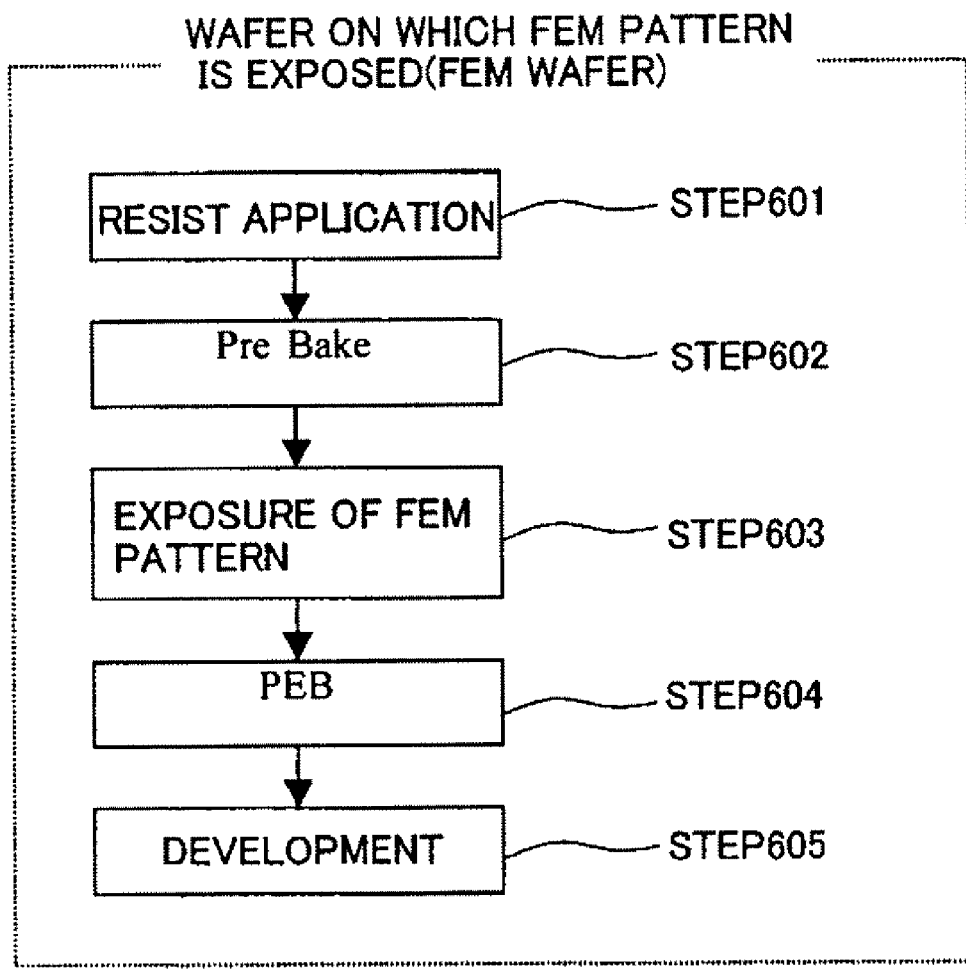
FIG. 4 is a flowchart of an FEM pattern manufacturing method in the flowchart shown in FIG. 3.

FIG. 4 shows a flow from the exposure to the development of the FEM pattern, and is a flowchart of the FEM pattern manufacturing method in the step 502.

Initially, the resist is applied onto the wafer, and a BARC and TARC are applied as necessity arises (step 601). The resist applied wafer is pre-baked to stabilize the resist characteristic (step 602). Next, the wafer is fed to the exposure apparatus, and the image of the FEM pattern is exposed on the wafer (step 603). Next, the wafer undergoes the post exposure bake ("PEB") (step 604) and the development (step 605), and the FEM pattern is formed on the FEM wafer.

Figure 7:
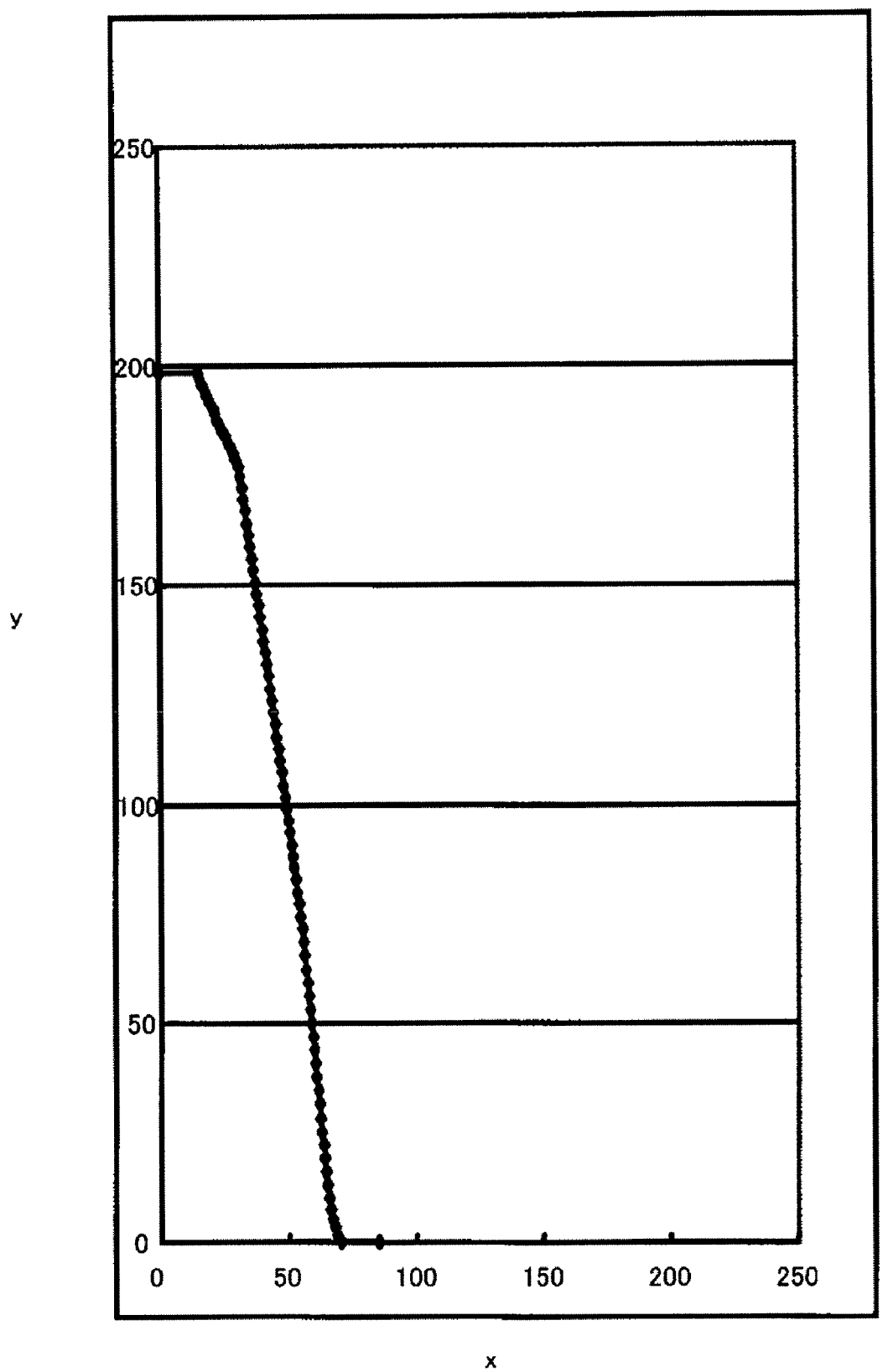
FIG. 7 is a graph that converts the image data shown in FIGS. 5 and 6 into shape information.

Next, shape information of the FEM pattern formed on the wafer is obtained with a stereo SEM or CD-AFM (step 503). FIGS. 5, 6 and 7 show actual measurement results with the stereo SEM. Here, FIG. 5 shows an image when the formed pattern is observed from the top of the wafer or in the height direction. FIG. 6 shows an image when the wafer on which the FEM pattern is formed is inclined by 15°. FIG. 7 is a graph of the pattern shape based on the image shown in FIG. 6.

FIG. 5 provides only a certain CD of the pattern, whereas plural measurement values that serve as pattern's shape information are available from the data of FIG. 7, such as a sidewall angle and a height in addition to the CD. Thereby, the pattern's three-dimensional shape can be measured.

Figures 8, 9:
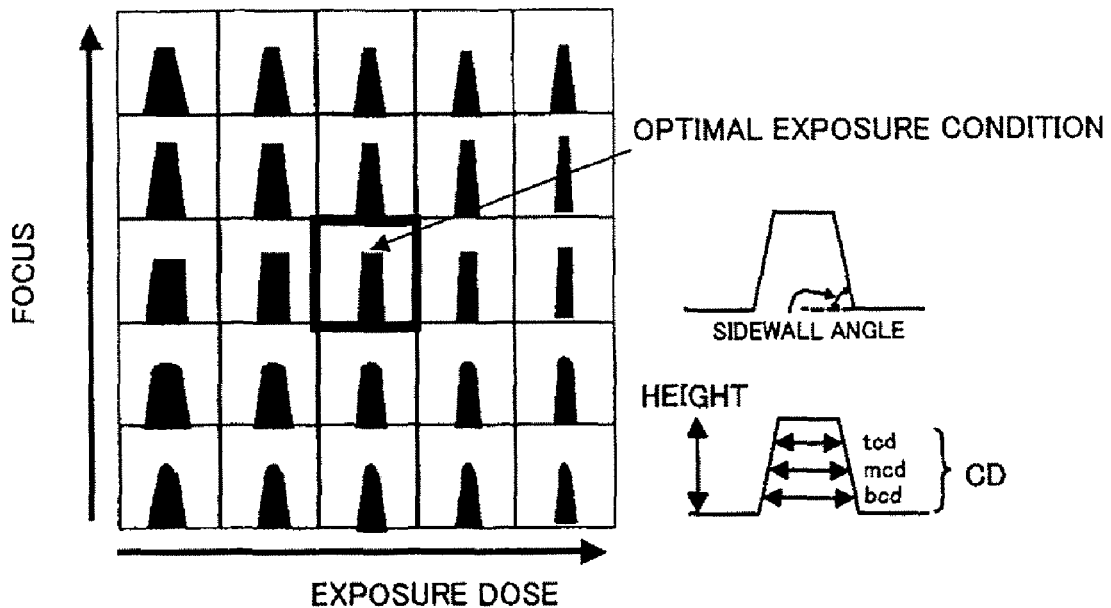
FIG. 8 is an enlarged view of part of a resist pattern in each shot of the FEM pattern formed on the wafer.
FIG. 9 is a graph obtained through a measurement of a CD, a height, and a sidewall angle in a three-dimensional shape of the resist pattern shown in FIG. 8.

The FEM pattern shown in FIG. 8 is exposure results of plural shots while the focus position and the exposure dose are varied. The ordinate axis denotes the focus position, and the abscissa axis denotes the exposure dose. Here, FIG. 8 is an enlarged view of the part of the pattern section in each shot of the FEM pattern formed on the wafer. FIG. 9 shows a measurement result illustration of CDs, such as tcd, mcd, and bcd, a height, and a sidewall angle ("swa") that represent pattern's shape information of the FEM pattern shown in FIG. 8 in each shot. FIG. 9 correlates the pattern's shape information (tcd, mcd, bcd, height, and swa) in each shot of the FEM pattern with the focus position and the exposure dose used to expose the FEM wafer. Here, "tcd" is a CD near the topside of the pattern. "bcd" is a CD near the downside of the pattern. "mcd" is a CD near a midpoint between the top and bottom sides of the pattern. The height and the sidewall angle are defined as shown in FIG. 8. The focus position is represented by a distance from the reference position that is set to the origin.

The optimal focus position and exposure dose are determined from a relationship between the shape information and the exposure condition (i.e., the focus position and the exposure dose). For example, the pattern enclosed in the thick frame in FIG. 8 is closest to the target pattern, and the focus position and exposure dose used to form this pattern become optimal and target values of the offsets. The optimal focus position and the optimal exposure dose are the center values of a so-called ED window that is an area defined as the desired CD added to the latitude. The latitude or permissible value is often ±10% of the CD. The reference value of the CD is a CD of the pattern, such as mcd, in the thick frame shown in FIG. 8.

Next follows a preparation of libraries corresponding to the exposure dose and the focus position using plural pieces of shape information obtained in step 503 through the multivariate analysis technique (step 504). A detailed description will now be given of a production of the library of the step 504.

Figure 10:
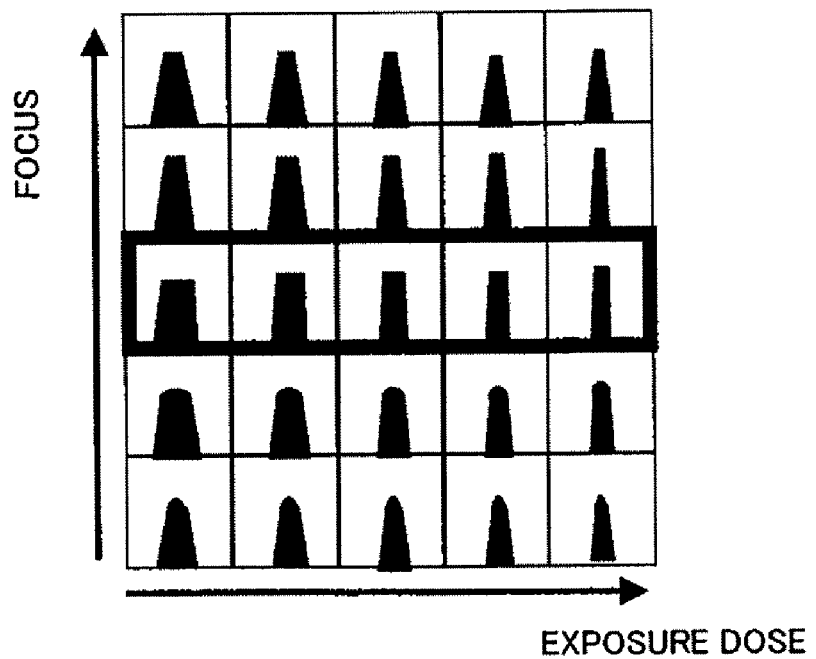
FIG. 10 is an enlarged view of part of a resist pattern in each shot of the FEM pattern formed on the wafer.
Figure 11:
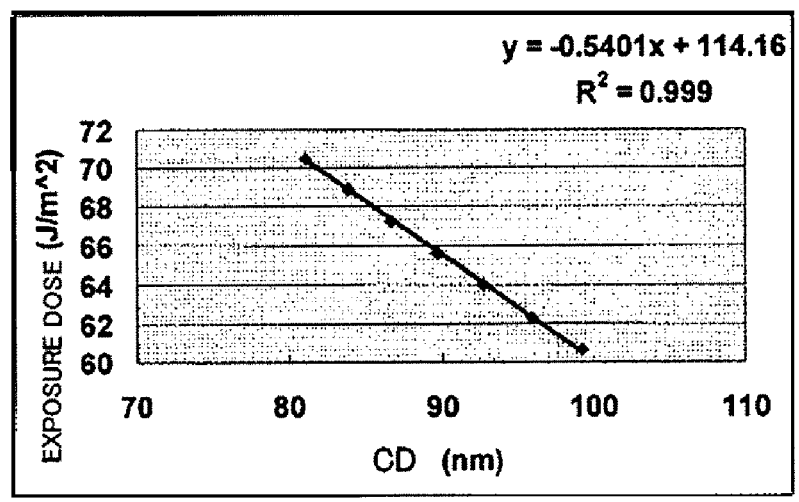
FIG. 11 is a graph showing a relationship between a CD and the exposure dose obtained from a pattern in a thick frame of the resist pattern shown in FIG. 10.

A description will now be given of the manufacturing method of the library used to calculate the offset of the exposure dose. A relational equation representing a relationship between the exposure dose and the CD, such as mcd, will be created from the shape information (see FIG. 9) of the FEM pattern formed on the FEM wafer. The relationship is formulized between the exposure dose and the CD variance of the plural patterns enclosed by the thick frame of the FEM pattern shown in FIG. 10. Here, similar to FIG. 8, FIG. 10 is an enlarged view of part of the pattern section in each shot of the FEM pattern formed on the wafer. FIG. 11 is a graph of a relationship between the CD and the exposure dose obtained from plural patterns in the thick frame in FIG. 10, and the relationship between the exposure dose and the CD is obtained through a polynomial approximation. The approximated equation is expressed by Equation 1 below, where $f_1$ is a function:

$$(\text{Exposure Dose}) = f_1 (\text{Critical Dimension}) \qquad \text{EQUATION 1}$$

The storage of the central processing apparatus 4 or the database 5 shown in FIG. 1 stores this approximated equation as a relational equation of a first library used to calculate the offset from the optimal exposure dose value.

The relationship between the CD variance amount and the exposure dose variance amount expressed by Equation 1 is invariable with the extrinsic factor, such as the resist's refractive index and thickness, exposure control and focusing of the exposure apparatus, a development time period, a developer's characteristic, an uneven hot plate, a PEB temperature and time period, and a reticle manufacturing error (flatness).

Figure 12:
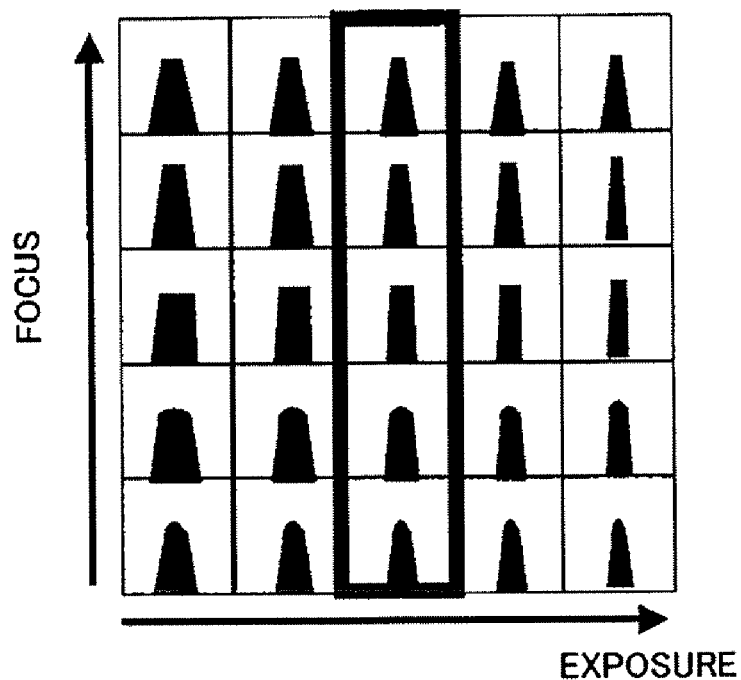
FIG. 12 is an enlarged view of part of a resist pattern in each shot of the FEM pattern formed on the wafer.
Figure 13:
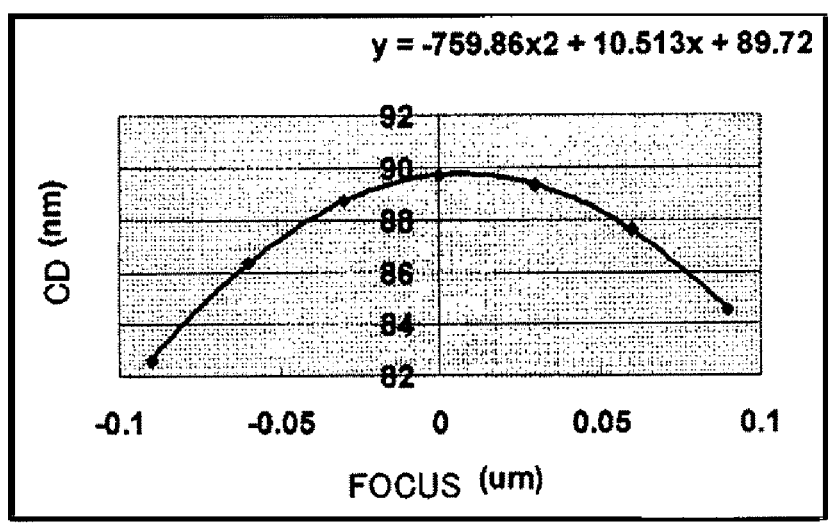
FIG. 13 is a graph showing a relationship between a CD and the exposure dose obtained from a pattern in a thick frame of the resist pattern shown in FIG. 12.

Next, a relationship is formulized between the CD and the focus position calculated from the plural patterns in the thick frame of the FEM pattern shown in FIG. 12. FIG. 13 is a graph of a relationship between the CD and the focus position obtained from the plural patterns shown in FIG. 12, and the relationship between them is obtained through the polynomial approximation. The polynomial approximation is expressed by Equation 2 below, where $f_2$ is a function:

$$(\text{Critical Dimension}) = f_2 (\text{Focus Position}) \qquad \text{EQUATION 2}$$

The storage of the central processing apparatus 4 or the database 5 stores this approximated equation as a relational equation of a second library used to calculate the offset from the optimal exposure dose value.

Similar to Equation 1, a relationship between the CD variance amount and the exposure dose variance amount expressed by Equation 1 is invariable with the above extrinsic factor.

Finally, a third library is defined as a relational equation among the CD (X), height (Y), and sidewall (Z) of the FEM pattern, and the focus position. When this equation is approximated by the N-th order polynomial, it is generally expressed by Equation 3. N is an integer used to calculate the orders of the CD, height and sidewall of the FEM pattern. $f_3$ is a function, and a1 to aN, b1 to bN, c1 to cN, and d0 are constants.

$$(\text{Focus Position}) = f_3 (CD, \text{height, sidewall}) = a_1 X + a_2 X^2 + \ldots + a_N X^N + b_1 Y + b_2 Y^2 + \ldots + b_N Y^N + c_1 Z + c_2 Z^2 + \ldots + c_N Z^N + d_0 \qquad \text{EQUATION 3}$$

The storage of the central processing apparatus 4 or the database 5 stores this approximated equation as a third library.

Equation 3 is a function using the CD, height, and sidewall of the FEM pattern for variables to calculate the focus position. However, the variables to be used are not limited to this embodiment, and may additionally use the exposure dose calculated by Equation 1 in addition to the CD, height, and sidewall of the FEM pattern.

Similar to Equations 1 and 2, the above relationship expressed by Equation 3 is invariable with the above extrinsic factor.

The relationships expressed by the above three equations do not depend upon the extrinsic factor, or no libraries expressed by these equations require an update due to the extrinsic factor. On the other hand, Japanese Patent Application, Publication No. 2003-142397 does not use these equations, and needs to update the library in accordance with the extrinsic factor.

In preparing the library, the FEM pattern is also prepared for a pattern having a large CD error based on the reticle pattern actually used for the mass production, and correlated with plural pieces of pattern shape information, and a library corresponding to the CD is additionally prepared.

The steps 501 to 504 shown in FIG. 1 for previously preparing the library are thus described.

A description will now be given of a sequence of the steps 505 to 508 used to calculate the offsets of the focus position and the exposure dose.

Initially, the entire shot on the wafer is exposed and developed similar to the mass-production stage using the reticle, wafer, and the exposure apparatus, which are used for the actual mass-production stage (step 505). The exposure condition at this time may use the center of the ED window calculated in the step 503.

Next, shape information of a pattern formed on the wafer by using the exposure apparatus is obtained (step 506). Similar to the step 503, the stereo SEM or CD-AFM is used to obtain plural pieces of shape information, such as a CD, height, and sidewall angle.

Next, the offset of the exposure dose and the offset of the focus position are calculated using the plural pieces of shape information obtained in the step 506 (step 507).

First, the offset of the exposure dose is calculated from the optimal exposure dose using the first library, creating a provisional exposure dose offset. Next, the offset of the focus position from the optimal focus position is calculated using the third library. A shift amount from the reference value of one value among the plural pieces of shape information is calculated based on the offset from the optimal focus position and the second library. An exposure dose to be corrected is obtained from this value using the first library, and added to the provisional exposure dose offset that has been obtained, creating the offset of the exposure dose.

Figure 14:
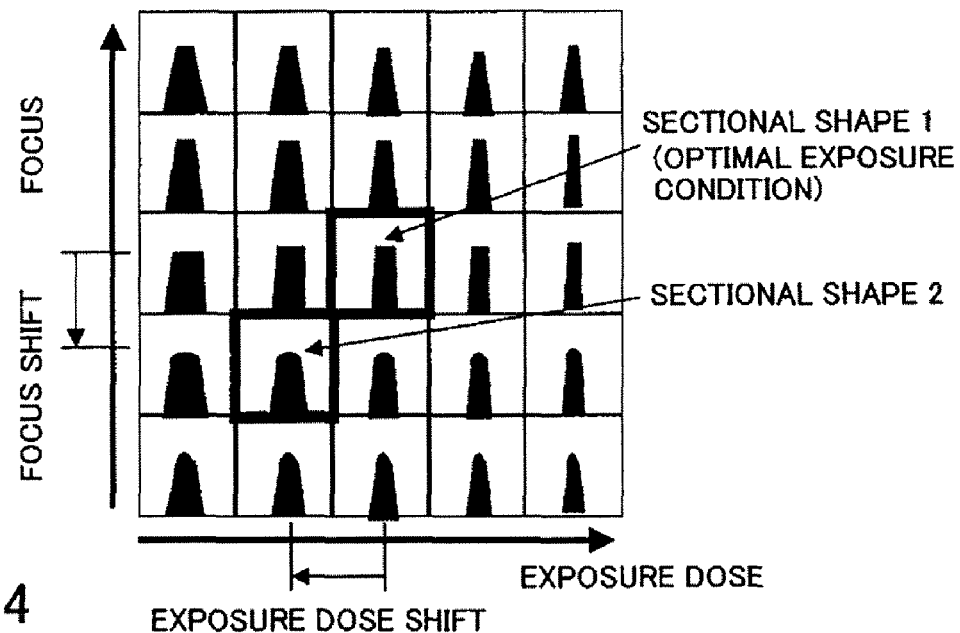
FIG. 14 is a graph showing the offsets from the optimal exposure dose and the optimal focus position in each shot of the FEM pattern formed on the wafer.
Figure 15:
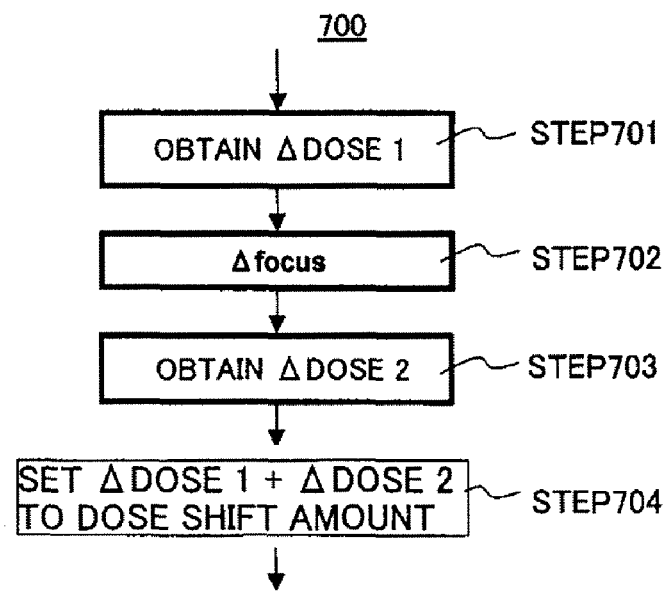
FIG. 15 is a flowchart used to calculate the offsets of the focus position and the exposure dose using the shape measurement value.
Figure 18:
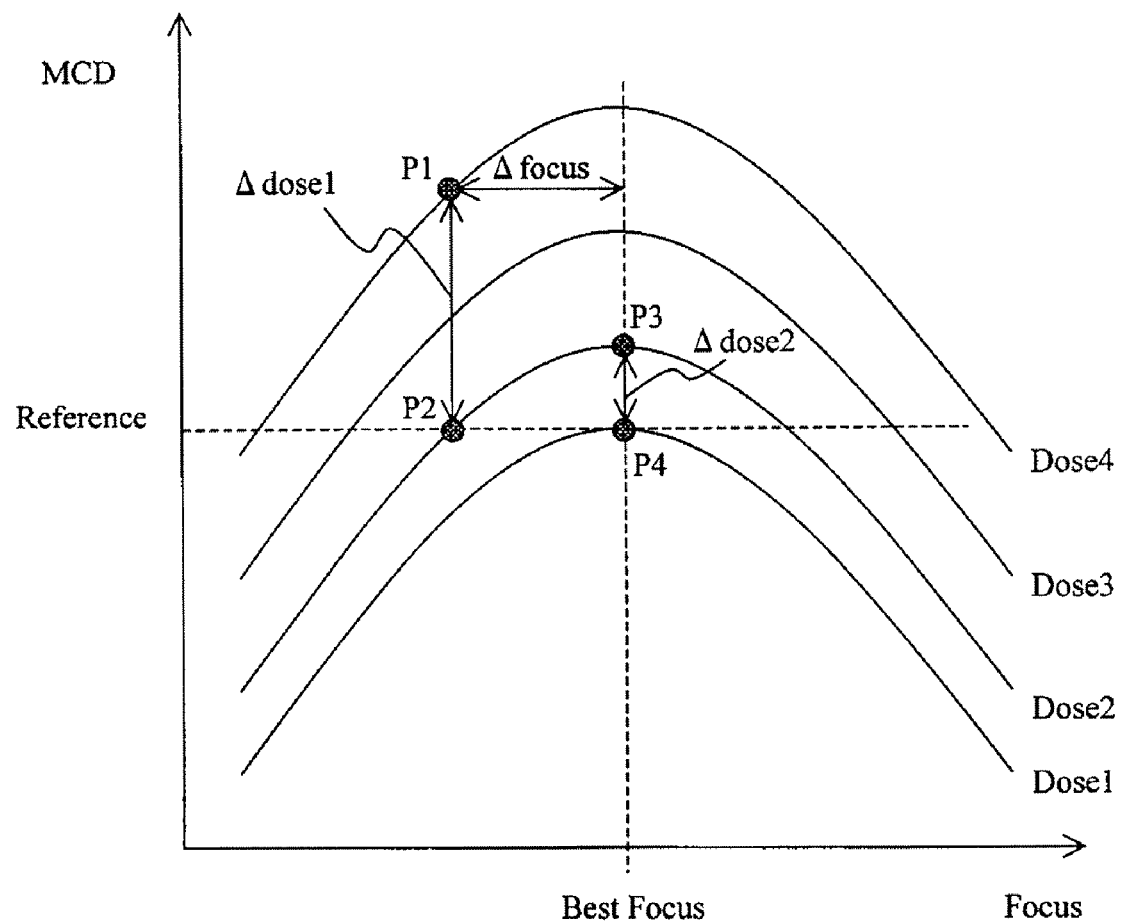
FIG. 18 is a plot of a relationship between the focus position and the CD for each exposure dose.

More specifically, a description will be given with reference to FIGS. 14, 15 and 18. Here, FIG. 14 is a graph showing the offsets from the optimal focus position and the optimal exposure dose, which are calculated from FIG. 8. FIG. 15 is a flowchart for calculating the offset of the focus position and the offset of the exposure dose using the shape information of the measured FEM pattern. FIG. 18 is a plot of a relationship among the focus position, mcd, and the exposure dose.

In the FEM pattern shown in FIG. 14, the sectional shape 1 is a shape exposed under the optimal exposure condition (i.e., the exposure dose and focus position). The sectional shape 2 is a shape exposed in the step 505. The exposure dose and the focus position shift from the optimal exposure condition, as shown in FIG. 14. P4 in FIG. 18 denotes a pattern shape having the sectional shape 1. P1 in FIG. 18 corresponds to the sectional shape 2.

In FIG. 15, the first library stored in the memory in step 504 and an input value of a difference between the reference value and one of plural pieces of pattern's shape information are used to calculate the offset Δdose 1 of the first exposure dose (step 701). More specifically, the offset Δdose 1 is calculated from a difference between one of the plural pieces of shape information indicative of the sectional shape 2 in FIG. 14, such as mcd, one of the plural pieces of shape information indicated by the sectional shape 1 of the optimal exposure condition (the reference value of mcd). Δdose 1 is a difference between dose 4 and dose 2, as shown in FIG. 18. When P1 shifts by Δdose 1, a position of P2 is obtained.

Next, the focus position is obtained with the above third library and input measurement values of plural pieces of shape information. A difference between the focus position and the optimal focus position is obtained as an offset Δfocus of the focus position (step 702). FIG. 18 shows Δfocus.

Next, the offset Δdose 2 of a second exposure dose is calculated in FIG. 15 (step 703). Δdose 2 is a necessary correction amount of the exposure dose to correct a CD shift of the resist pattern that newly occurs when the focus position is corrected by calculated Δfocus. A position of P3 is obtained when P2 shifts by Δfocus with dose 2 as shown in FIG. 18, and it is understood that the CD shift occurs.

Δdose 2 can be calculated by substituting Δfocus for the second library relating to the exposure dose obtained in the step 504, by calculating the CD shift amount ΔCD, and by substituting ΔCD for the first library. When P3 shifts by Δdose 2, as shown in FIG. 18, a position of P4 is obtained, and Δdose 2 is a difference between dose 1 and dose 2. Finally, the exposure dose offset Δdose of the resist pattern is calculated as Δdose=Δdose 1+Δdose 2 (step 704).

A location the CD size difference is discernable on the actual reticle based on the reticle inspection data obtained in the step 501. Therefore, the offsets from the optimal exposure condition, i.e., the focus position and the exposure dose, are calculated using the library in accordance with the reticle inspection data.

The offsets of the focus position and the exposure dose are thus calculated through steps 505 to 507 shown in FIG. 3.

Finally, the offset Δdose of the exposure dose, the offset Δfocus of the focus position, which are thus obtained in the above procedure, are fed back to the exposure apparatus, or fed forward (step 508). Then, the wafer 40 is exposed with the optimized exposure condition in the mass-production stage (step 509), and the resist pattern that is exposed under the optimal exposure condition becomes a target shape.

This embodiment uses only one value, such as mcd, among the plural shape measurement values for the library necessary to correct the exposure dose, but can use other solid shape information. In addition, this embodiment uses a linear or quadratic approximated equation for the approximated equation used to calculate the exposure dose, but can use cubic or higher approximated equation.

When the exposure apparatus is a scanner, the exposure region has a slit shape. When the step 506 shown in FIG. 3 measures shapes in plural areas corresponding to plural points in the slit, the offset of the focus position is determined by a plane for controlling a least square approximation plane of the offset of the focus in plural areas, and the exposure may be performed while the focus position and the tilt amount are varied.

For example, when the aberration of the projection optical system is variable in the exposure apparatus, and accords with the surface shape of the offset of the focus position at plural points, the exposure may be provided, for example, by changing the aberration of the projection optical system and the plane of the even function that becomes a curvature of field, rather than a least squares approximation plane.

With respect to the exposure dose, the optimal value may differ according to shots on the wafer, or an optimal exposure dose may be set at different positions in each shot. The offset amount of the exposure dose may be set at each position in the slit-shaped exposure region. Even when the offset of the exposure dose is set in the reticle or wafer's scanning direction, a slit width of the illumination optical system may be made variable, or another measure may be made.

Thus, when the pattern's shape information is obtained for each of plural areas on the wafer, the optimal offsets of the exposure dose and the focus position can be calculated for the entire device.

As discussed above, this exposure method 500 does not expose, in the mass-production stage, unlike the FEM, by minutely changing a focus position, but sets the optimal offsets of the exposure dose and focus position by considering the error due to the extrinsic factor from one exposure condition. Therefore, even when the extrinsic factor that affects the CD fluctuates, the library does not have to be updated. As a result, the exposure method 500 can process the wafer at a high throughput, and inexpensively provide liquid crystal and other devices. In addition, the operation processing described above is performed as a computer program using the central processing apparatus 4, the offset of the exposure dose and the focus position are calculated.

Figure 16:
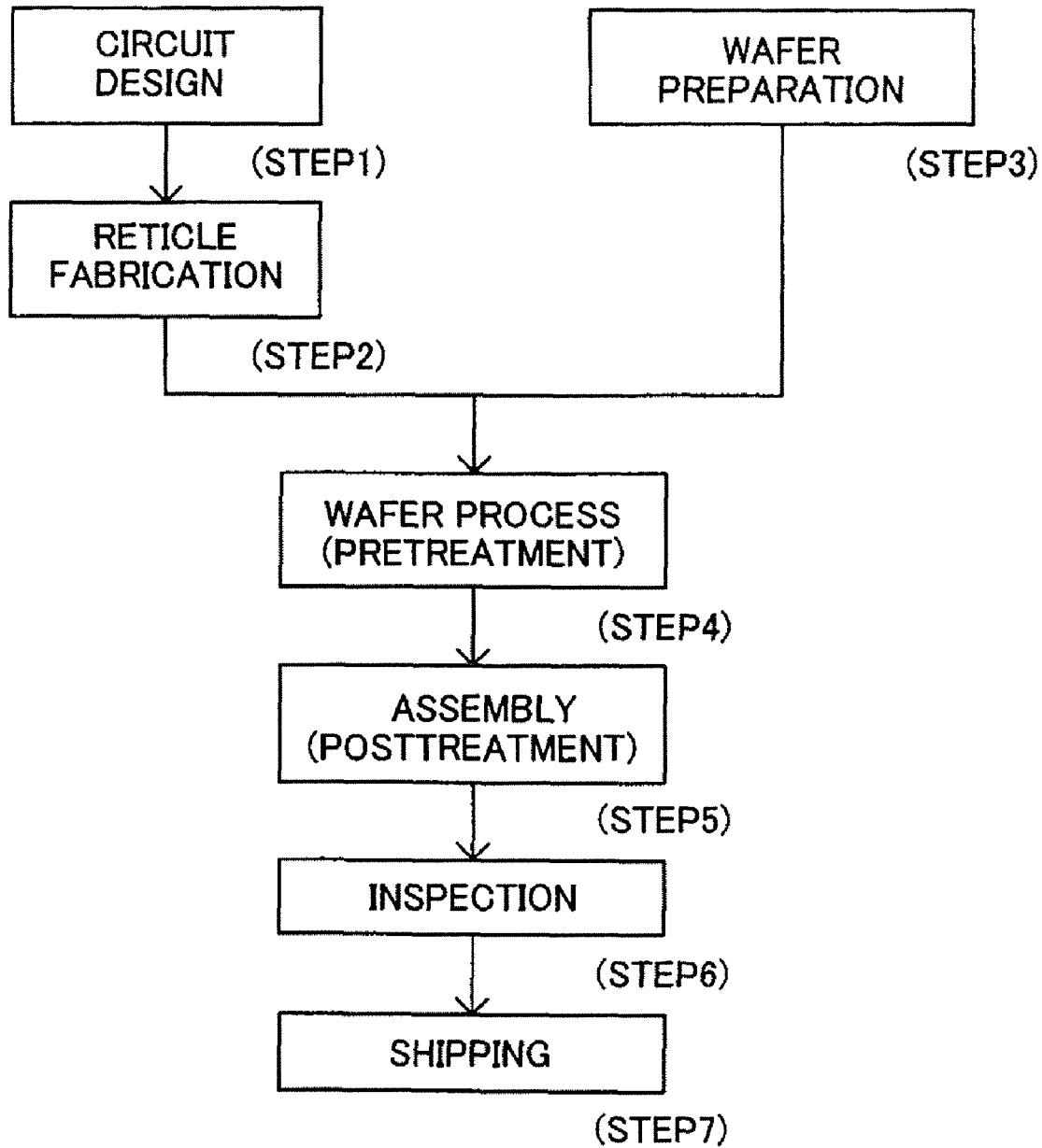
FIG. 16 is a flowchart of a device manufacturing method using the exposure apparatus shown in FIG. 2.

A description will now be given of a semiconductor device manufacturing process using the above exposure method. FIG. 16 is a flowchart for explaining a fabrication of devices. Here, a description will be given of a fabrication of a semiconductor device as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is referred to as a pretreatment, forms actual circuitry on the wafer through photolithography using the reticle and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

Figure 17:
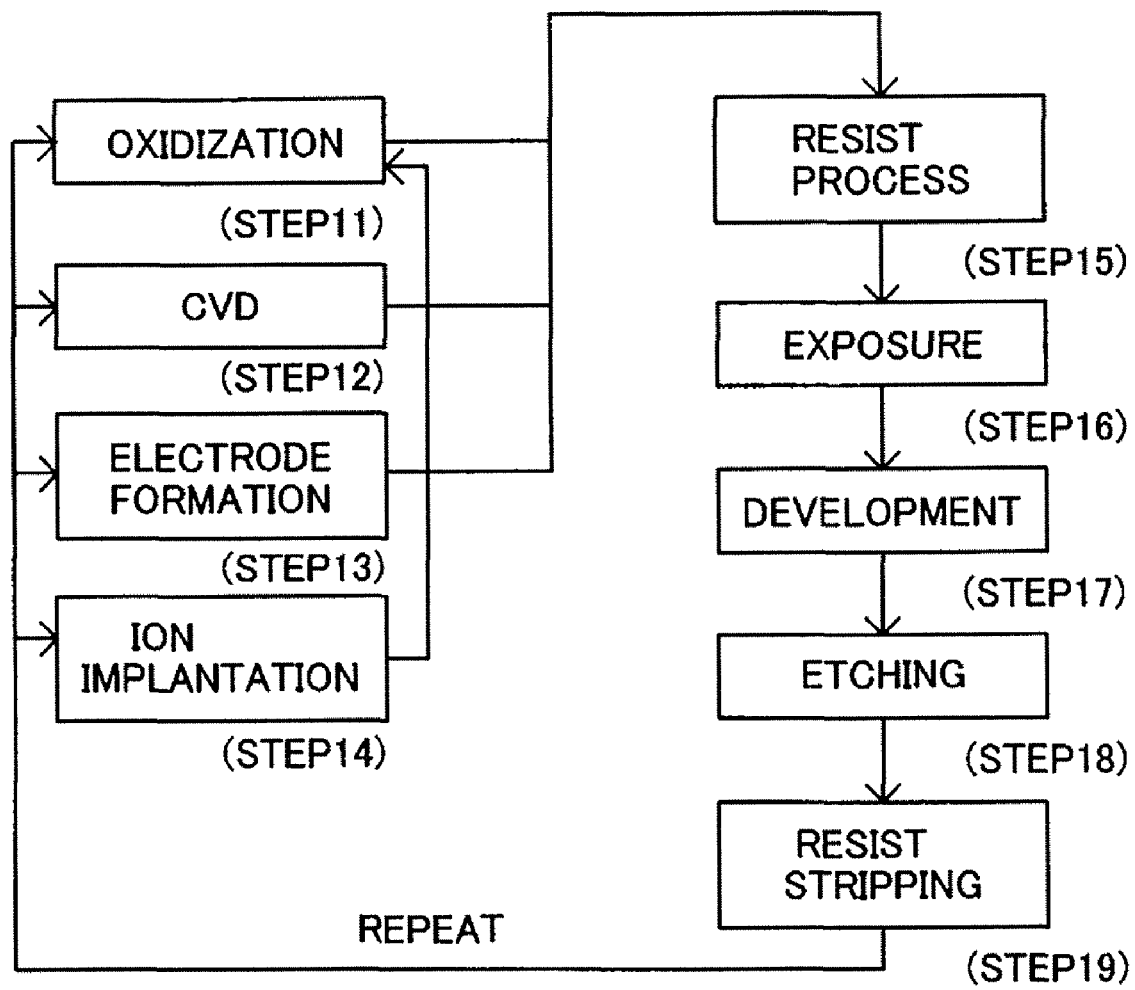
FIG. 17 is a detailed flowchart for Step 4 shown in FIG. 16.

FIG. 17 is a detailed flowchart of the wafer process. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the above exposure method to expose a reticle pattern onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer.

The entire disclosure of Japanese Patent Applications Nos. 2006-000950, filed on Jan. 5, 2006 and 2006-353324, filed on Dec. 27, 2006, including claims, specification, drawings, and abstract incorporated herein by reference in its entirety.

As many apparently widely different embodiments of the present invention can be made without departing from the sprit and scope thereof, it is to be understood that the invention is not limited to the specific embodiments thereof except as defined in the claims.

What is claimed is:

1. A method for calculating an offset of an exposure dose and an offset of a focus position in an exposure apparatus that exposes a substrate via an original, said method comprising:
   a first step of preliminarily calculating a first library that represents a relation between the exposure dose and a critical dimension, a second library that represents a relation between the critical dimension and the focus position, and a third library that represents a relation between the focus position and information of a shape of a pattern;

a second step of obtaining information of a shape of a pattern formed on the substrate using the exposure apparatus;

a third step of calculating a first shift amount between a critical dimension contained in the information of the shape of the pattern and a reference value of the critical dimension;

a fourth step of calculating, by using the first library, an offset of a first exposure dose to correct the first shift amount of the critical dimension, which is calculated in the third step;

a fifth step of calculating the offset of the focus position based on the information of the shape of the pattern by using the third library;

a sixth step of calculating, by using the second library, a second shift amount of a critical dimension that occurs when the focus position, with a predetermined exposure amount, is shifted by the offset of the focus position, which is calculated in the fifth step, and calculating, by using the first library, a second exposure dose to correct the second shift amount; and a seventh step of calculating the offset of the exposure dose by adding the offset of the first exposure dose to the offset of the second exposure dose.

2. A method according to claim 1, wherein the second step obtains the information of the shape of the pattern for each of plural areas on the substrate.

3. A method according to claim 2, wherein the fifth step calculates the offset of the focus position for each of plural areas on the substrate.

4. An exposure method for exposing a substrate based on an offset of an exposure dose and an offset of the focus position calculated by a method according to claim 1.

5. A non-transitory computer-readable storage medium storing a program that when executed by a computer causes the computer to execute a method for calculating an offset of an exposure dose and an offset of a focus position in an exposure apparatus that exposes a substrate via an original, said method comprising:

a first step of preliminarily calculating a first library that represents a relation between the exposure dose and a critical dimension, a second library that represents a relation between the critical dimension and the focus position, and a third library that represents a relation between the focus position and information of a shape of a pattern;

a second step of obtaining information of a shape of a pattern formed on the substrate using the exposure apparatus;

a third step of calculating a first shift amount between a critical dimension contained in the information of the shape of the pattern and a reference value of the critical dimension;

a fourth step of calculating, by using the first library, an offset of a first exposure dose to correct the first shift amount of the critical dimension, which is calculated in the third step;

a fifth step of calculating the offset of the focus position based on the information of the shape of the pattern by using the third library;

a sixth step of calculating, by using the second library, a second shift amount of a critical dimension that occurs when the focus position, with a predetermined exposure amount, is shifted by the offset of the focus position, which is calculated in the fifth step, and calculating, by using the first library, a second exposure dose to correct the second shift amount; and a seventh step of calculating the offset of the exposure dose by adding the offset of the first exposure dose to the offset of the second exposure dose.

6. A device manufacturing method comprising the steps of:

exposing a substrate using an exposure method according to claim 4; and developing the substrate that has been exposed.

* * * * *